United States Patent
Allen et al.

(10) Patent No.: US 9,748,131 B2
(45) Date of Patent: *Aug. 29, 2017

(54) LOW TEMPERATURE ADHESIVE RESINS FOR WAFER BONDING

(71) Applicant: INTERNATIONAL BUSINESS MACHINES CORPORATION, Armonk, NY (US)

(72) Inventors: Robert D. Allen, San Jose, CA (US); Paul S. Andry, Yorktown Heights, NY (US); Jeffrey D. Gelorme, Burlington, CT (US); Li-wen Hung, Mahopac, NY (US); John U. Knickerbocker, Yorktown Heights, NY (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/943,691

(22) Filed: Nov. 17, 2015

(65) Prior Publication Data

US 2016/0133501 A1    May 12, 2016

Related U.S. Application Data

(63) Continuation of application No. 14/536,175, filed on Nov. 7, 2014, now Pat. No. 9,324,601.

(51) Int. Cl.
| | | |
|---|---|---|
| *H01L 21/00* | (2006.01) | |
| *H01L 23/34* | (2006.01) | |
| *H01L 21/683* | (2006.01) | |
| *H01L 25/03* | (2006.01) | |
| *H01L 21/762* | (2006.01) | |
| *H01L 23/00* | (2006.01) | |
| *H01L 21/463* | (2006.01) | |
| *H01L 21/306* | (2006.01) | |

(Continued)

(52) U.S. Cl.
CPC .... *H01L 21/6836* (2013.01); *H01L 21/30604* (2013.01); *H01L 21/463* (2013.01);
(Continued)

(58) Field of Classification Search
CPC ... H01L 24/27; H01L 21/76256; H01L 25/03; H01L 21/6835; H01L 27/1266;
(Continued)

(56) References Cited

U.S. PATENT DOCUMENTS

| | | | |
|---|---|---|---|
| 7,867,876 B2 * | 1/2011 | Codding | H01L 21/6835 438/458 |
| 7,883,991 B1 * | 2/2011 | Wu | H01L 21/6835 257/686 |

(Continued)

FOREIGN PATENT DOCUMENTS

| | | |
|---|---|---|
| JP | 2004064040 A | 2/2004 |
| JP | 2007009022 A | 1/2007 |

(Continued)

OTHER PUBLICATIONS

List of IBM Patents or Patent Applications Treated as Related dated Nov. 17, 2015, 2 pages.

(Continued)

*Primary Examiner* — Alonzo Chambliss
(74) *Attorney, Agent, or Firm* — Tutunjian & Bitetto, P.C.; Louis J. Percello

(57) ABSTRACT

A method for adhesive bonding in microelectronic device processing is provided that includes bonding a handling wafer to a front side of a device wafer with an adhesive comprising phenoxy resin; and thinning the device wafer from the backside of the device wafer while the device wafer is adhesively engaged to the handling wafer. After the device wafer has been thinned, the adhesive comprising phenoxy resin may be removed by laser debonding, wherein the device wafer is separated from the handling wafer.

13 Claims, 5 Drawing Sheets

(51) Int. Cl.
*H01L 21/304* (2006.01)
*H01L 21/768* (2006.01)

(52) U.S. Cl.
CPC .... *H01L 21/6835* (2013.01); *H01L 21/76256* (2013.01); *H01L 24/27* (2013.01); *H01L 24/29* (2013.01); *H01L 24/83* (2013.01); *H01L 25/03* (2013.01); *H01L 21/304* (2013.01); *H01L 21/76898* (2013.01); *H01L 2221/6834* (2013.01); *H01L 2221/68327* (2013.01); *H01L 2221/68359* (2013.01); *H01L 2221/68381* (2013.01)

(58) Field of Classification Search
CPC ... H01L 21/78; H01L 21/2007; H01L 21/304; H01L 21/02013; H01L 21/02016; H01L 24/29; H01L 24/83; H01L 21/463; H01L 21/6836; H01L 21/30604
See application file for complete search history.

(56) References Cited

U.S. PATENT DOCUMENTS

| | | | | |
|---|---|---|---|---|
| 7,932,614 B2* | 4/2011 | Codding | ............ | H01L 21/6835 257/783 |
| 8,247,261 B2 | 8/2012 | Bedell et al. | | |
| 8,455,301 B2* | 6/2013 | Lee | ............ | H01L 21/561 257/622 |
| 9,324,601 B1* | 4/2016 | Allen | ............ | H01L 25/03 |
| 2006/0252234 A1* | 11/2006 | Saiki | ............ | C09J 7/0246 438/464 |
| 2008/0090085 A1 | 4/2008 | Kawate | | |
| 2008/0241995 A1* | 10/2008 | Fukui | ............ | C08G 59/08 438/109 |
| 2011/0129989 A1* | 6/2011 | Urano | ............ | H01L 21/304 438/459 |
| 2012/0248634 A1 | 10/2012 | Mitsukura | | |
| 2014/0091296 A1 | 4/2014 | Yoo | | |
| 2014/0103499 A1 | 4/2014 | Andry | | |
| 2015/0179493 A1 | 6/2015 | Varghese | | |

FOREIGN PATENT DOCUMENTS

| | | |
|---|---|---|
| WO | 03077618 A2 | 9/2003 |
| WO | 2013161864 A1 | 10/2013 |
| WO | 2014080918 A1 | 5/2014 |

OTHER PUBLICATIONS

International Search Report issued in International Publication No. WO 2016/071788 dated Feb. 2, 2016, 3 pages.

\* cited by examiner

LOW TEMPERATURE ADHESIVE RESINS FOR WAFER BONDING

BACKGROUND

Technical Field

The present disclosure relates generally to adhesives employed in wafer bonding.

Description of the Related Art

Temporary wafer bonding/debonding is an important technology for implementing the fabrication of semiconductor devices, photovoltaic devices, and electrical devices of micron and nanoscale. Bonding is the act of attaching a device wafer, which is to become a layer in a final electronic device structure, to a substrate or handling wafer so that it can be processed, for example, with wiring, pads, and joining metallurgy. Debonding is the act of removing the processed device wafer from the substrate or handling wafer so that the processed device wafer may be employed into an electronic device. Some existing approaches for temporary wafer bonding/debonding involve the use of an adhesive layer placed directly between the silicon device wafer and the handling wafer. When the processing of the silicon device wafer is complete, the silicon device wafer may be released from the handling wafer by various techniques, such as by exposing the wafer pair to chemical solvents delivered by perforations in the handler, by mechanical peeling from an edge initiation point or by heating the adhesive so that it may loosen to the point where the silicon device wafer may be removed by sheering.

SUMMARY

In one embodiment, a method for adhesive bonding in microelectronic device processing is provided that includes bonding a handling wafer to a front side surface of a device wafer with an adhesive comprising phenoxy resin; and thinning the device wafer from the backside surface of the device wafer while the device wafer is adhesively engaged to the handling wafer. After the device wafer has been thinned, the adhesive comprising phenoxy resin may be removed by laser debonding, wherein the device wafer is separated from the handling wafer.

In another embodiment, the method of adhesive bonding may include bonding a handling wafer to a front side of a device wafer with an adhesive comprising phenoxy resin, wherein the adhesive is cured at a temperature of less than 300° C. The cured phenoxy resin may have a viscosity greater than $1 \times 10^5$ Pa·Sec. Following bonding of the handling wafer to the device wafer, the device wafer may be thinned from the backside surface of the device wafer, while the device wafer is adhesively engaged to the handling wafer. After the device wafer has been thinned, the adhesive comprising phenoxy resin may be removed, wherein the device wafer is separated from the handling wafer.

In another embodiment, a method of adhesive bonding is provided that may include bonding a first semiconductor substrate to a second semiconductor substrate with an adhesive comprising phenoxy resin, wherein the adhesive is cured at a temperature of less than 300° C. The cured phenoxy resin may have a viscosity greater than $1 \times 10^5$ Pa·Sec.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
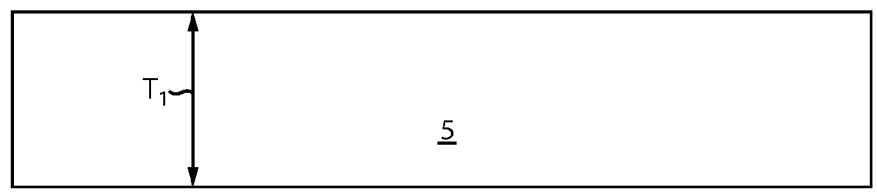
FIG. 1 is a side cross-sectional view of a semiconductor substrate that may be employed as a device wafer in a method of forming a semiconductor device that employs adhesive bonding of the device wafer to a handling wafer as part of a wafer thinning sequence, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods, compositions and structures disclosed herein provide low cost, thermoplastic materials that can be used as adhesives in temporary bonding of thin layers of semiconductor material, such as silicon containing material layers, to wafer handler substrates. As used herein, the term "thin" denotes a thickness of 5 microns to 10 microns. In some embodiments, the methods, compositions and structures disclosed herein provide an adhesive that can be used in method that employ laser debonding. Laser debonding is one method that is typically employed in layer transfer techniques used in microelectronic production, such as the formation of microelectronics employing silicon-containing substrates.

Typically, in laser debonding, a polyimide material is used as the adhesive connecting the device wafer to a handling wafer, wherein ablating the polyimide adhesive employs a deep UV excimer laser that debonds the device wafer from the handling wafer. The handling wafer may be a coefficient of thermal expansion (CTE) matched glass plate. In some examples, the polyimide that is used as the adhesive is known in the industry by tradename HD3007, which may be available from HD Microsystems, Inc. It has been determined that one disadvantage of using a polyimide adhesive material as the adhesive in wafer bonding methods in microelectronics device manufacturing is the relatively high processing temperature that is required to convert the polyimide precursor, i.e., polyamic acid, to a fully imidized polyimide before completing bonding of the handling wafer to the device wafer. The temperature range that is typically used to cure the polyimide to provide imidization ranges 300° C. to 400° C. In addition, the nature of a polyimide polymer is usually relatively stiff and rigid such that the polymer requires a high temperature to soften and bond to the handling wafer. The high temperatures required for both steps can do damage to sensitive devices that are included in the device wafer. Further, the high temperatures required for curing the polyimide for imidization and to soften the polyimide for softening can cause stresses in the device wafer that induce warping in the device wafer after cooling. Additionally, in order to remove polyimide residues that remain after debonding long soak times in strong hot solvents, such as N-methylpyrrolidone (NMP) and dimethyl sulfoxide (DMSO), may be required.

Adhesives composed of poly (meth)acrylates that do not require high temperatures to imidize or bond and that use less aggressive removing solvents, such as those available from Tokyo Ohka Kogyo Co. (TOK) and Brewer Science, are too costly and have too low a viscosity during bonding above 170° C. This low viscosity at temperatures greater than 170° C. can cause 'squeeze out' of adhesive material at bonding temps of approximately 200° C. to 210° C.

In some embodiments, the methods, structures and compositions provided herein provide a set of resins that are low cost and have been determined to have good bond/debonding performance for adhesives at lower temperatures than polyimides without exhibiting squeeze-out phenomena. In some embodiments, the present disclosure provides a method of adhesive bonding that may include bonding a first semiconductor substrate to a second semiconductor substrate with an adhesive comprising phenoxy resin, wherein the adhesive is cured at a temperature of less than 300° C. The cured phenoxy resin may have a viscosity greater than $1 \times 10^5$ Pa·Sec.

As used herein, the term "phenoxy resin" denotes a family of Bisphenol A/epichlorohydrin linear polymers. Phenoxy resins are typically tough and ductile thermoplastic materials having high cohesive strength and good impact resistance. The backbone ether linkages and pendant hydroxyl groups promote wetting and bonding to polar substrates. Structurally, in some examples, the phenoxy resin may be polyhydroxyether having terminal alpha-glycol groups. In some embodiments, weight-average molecular weights for the phenoxy resins in accordance with the present disclosure may range from approximately 25,000 to above 60,000. The highest polymeric species of phenoxy resin may exceed 250,000 daltons. olydispersity is very narrow, typically less than 4.0. An average molecule contains 40 or more regularly spaced hydroxyl groups. The phenoxy resin may be a thermoplastic resin suitable for use as an adhesive in low temperature, e.g., less than 300° C., wafer bonding and/or laser debonding applications.

In some embodiment of the present disclosure, the phenoxy resin is a Phenoxy Resin PKHC®, PKHH® or PKHJ® having the following formula:

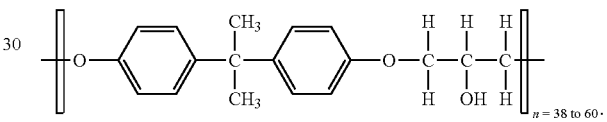

PKHH is available from InChem Corp., in which PKHH phenoxy resin has the IUPAC name: 2-(chloromethyl)oxirane; 4-[2-(4-hydroxyphenyl)propan-2-yl]phenol, and chemical formula $C_{18}H_{21}ClO_3$. PKHJ and PKHC are also available from InChem Corp. PKHH phenoxy resin has a molecular weight of approximately 52,0000 Mw/13,000 Mn (avg.), and has a viscosity ranging from 180-280 cP (Brookfield @ 25° C. 20% in cyclohexanone). PKHJ phenoxy resin may have a molecular weight of approximately 57,0000 Mw/16,000 Mn (avg.), and has a viscosity ranging from 600-775 cP (Brookfield @ 25° C. 20% in cyclohexanone). PKHC phenoxy resin may have a molecular weight of approximately 43,0000 Mw/11,000 Mn (avg.), and has a viscosity ranging from 410-524 cP (Brookfield @ 25° C. 20% in cyclohexanone).

In some embodiments, the phenoxy resin adhesive may be a phenoxy resin that is modified with a dye. In some embodiments, the present disclosure provides for covalently reacting hydroxyl functional adhesive polymers with appropriately reactive dye molecules to permanently attach the dye for ease of recycling. For example, the hydroxyl groups of the phenoxy resin may be esterified with acid functional molecules. For example, the phenoxy resin may be modified, e.g., esterified, with 9-anthracene carboxylic acid. In another example, the phenoxy resin may be modified, e.g., esterified, with 2-anthraquinon carboxylic acid. It is noted that the above examples are provided for illustrative purposes only, as other dyes, e.g., other carboxylic acid containing molecules, may be used to modify the phenoxy resin. For example, other hydroxyl reactive materials are available and useful also for dye attachment such as isocyanate, chloromethyl, chlorosulfonyl and combinations thereof. A covalently bonded dye, as described above can be used to both collect and reuse adhesive that is washed off of a device wafer following its use.

The phenoxy resin adhesives disclosed herein may be used in any layer/substrate transfer and/or substrate bonding method used for forming semiconductor devices, memory devices, photovoltaic devices, microelectronic devices and nanoscale devices. For example, the phenoxy resin adhesives may be used in process that employ mechanical spalling, such as the method described in U.S. Pat. No. 8,247,261 titled "THIN SUBSTRATE FABRICATION USING STRESS INDUCED SUBSTRATE SPALLING". The phenoxy resin may also be used as a bonding adhesives in methods for forming III-V semiconductor containing semiconductor devices and photovoltaic devices that include a reusable germanium (Ge) containing substrate as a growth surface. In this example, once the III-V device is formed it is bonded to a supporting substrate, and the reusable germanium (Ge) containing substrate is removed from the III-V device to be used as the growth surface for forming another device. The phenoxy resins may also be used in layer transfer processes that employ smart cut to separate a portion of a material layer for transfer to a supporting substrate. Smart cut may include implanting a dopant species, such as hydrogen, into a material layer to provide a weakened interface across when the material layer is to be cleaved. A portion of the cleaved material layer may be adhesively bonded to a supporting substrate using the phenoxy resins. In other embodiments, the phenoxy resin may be employed in a substrate, i.e., device wafer, thinning process. It is noted that the above examples of adhesive applications for the phenoxy resin is provided for illustrative purposes only, and is not intended to limit the present disclosure. Further details of the methods and structures of the present disclosure that employ a phenoxy resin as a bonding adhesive as part of a method sequence for forming semiconductor devices that includes wafer thinning and debonding of a handling wafer are now discussed with greater detail with reference to FIGS. 1-6.

FIG. 1 depicts one embodiment of a device wafer 5, e.g., semiconductor substrate, that may be employed in at least one embodiment of the present disclosure. In some embodiments, the device wafer 5 may be provided by a bulk semiconductor substrate. The bulk semiconductor substrate may have a single crystal, i.e., monocrystalline, crystal structure. In some embodiments, the device wafer 5 is composed of a silicon including material. In some embodiments, the silicon including material that provides the device wafer 5 may include, but is not limited to silicon, single crystal silicon, multicrystalline silicon, polycrystalline silicon, amorphous silicon, strained silicon, silicon doped with carbon (Si:C), silicon alloys or any combination thereof. In other embodiments, the device wafer 5 may be a semiconducting material that may include, but is not limited to, germanium (Ge), silicon germanium (SiGe), silicon germanium doped with carbon (SiGe:C), germanium alloys, GaAs, InAs, InP as well as other III/V and II/VI compound semiconductors. The thickness T1 of the device wafer 5 may range from 10 microns to a few millimeters.

Figure 2:
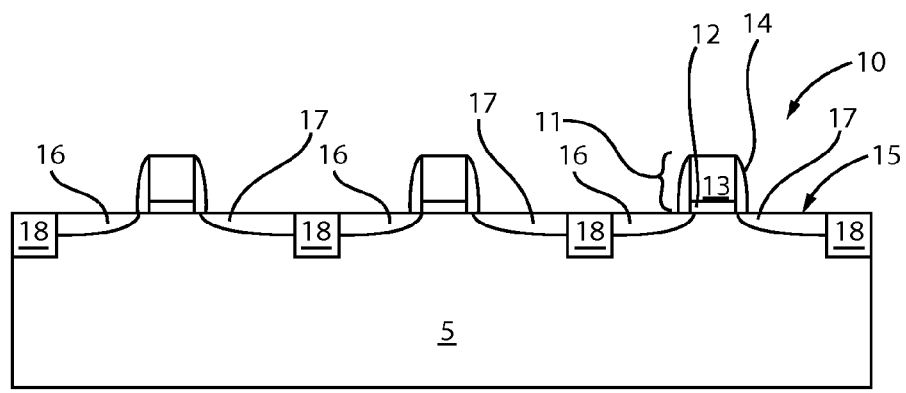
FIG. 2 is a side cross-sectional view of forming semiconductor devices on a front surface of the device wafer, in accordance with one embodiment of the present disclosure.

FIG. 2 depicts forming semiconductor devices 10 on a front surface 15 of the device wafer 5. As used herein, "semiconductor device" refers to an intrinsic semiconductor material that has been doped, that is, into which a doping agent has been introduced, giving it different electrical properties than the intrinsic semiconductor. In some embodiments, the semiconductor devices 10 are field effect transistors (FETs). A field effect transistor (FET) is a transistor in which output current, i.e., source-drain current, is controlled by the voltage applied to the gate. A field effect transistor typically has three terminals, i.e., gate, source and drain. The semiconductor devices 10 that may be formed using the methods of the present disclosure are applied to may be planar semiconductor devices, FinFETS, Trigate semiconductor devices, nanowire semiconductor devices or a combination thereof. The semiconductor devices 10 disclosed herein may also be provided by memory devices, e.g., flash memory or eDRAM memory.

In some embodiments, the semiconductor devices 10 may include a gate structure 11 that includes at least one gate dielectric 12, at least one gate conductor 13 and at least one gate sidewall spacer 14.

The at least one gate dielectric 12 may be a dielectric material, such as $SiO_2$, or alternatively high-k dielectrics, such as oxides of Ta, Zr, Al or combinations thereof In another embodiment, the at least one gate dielectric 12 is comprised of an oxide, such as $SiO_2$, $ZrO_2$, $Ta_2O_5$ or $Al_2O_3$. In one embodiment, the at least one gate dielectric 12 may have a thickness ranging from 1 nm to 10 nm.

The at least one gate conductor layer 13 may include a metal gate electrode. The metal gate electrode may be any conductive metal including, but not limited to W, Ni, Ti, Mo, Ta, Cu, Pt, Ag, Au, Ru, Ir, Rh, and Re, and alloys that include at least one of the aforementioned conductive elemental metals. In other embodiments, the at least one gate conductor 13 may include a doped semiconductor material, such as a doped silicon containing material, e.g., doped polysilicon.

In some embodiments, a gate dielectric (not shown) may be present atop the at least one gate conductor 13. The at least one gate dielectric cap may be composed of an oxide or nitride material.

Each of the material layers for the gate dielectric cap, the at least one gate conductor layer 13, and the gate dielectric layer 12 may be formed using a deposition or growth process. For example, the gate dielectric layer 12 and the gate dielectric cap may be formed using a chemical vapor deposition (CVD) process, such as plasma enhanced CVD (PECVD). The gate conductor layer 13 may be formed using a physical vapor deposition (PVD) process, e.g., sputtering, when the gate conductor layer 13 is composed of a metal, or the gate conductor layer 13 may be formed using a chemical vapor deposition (CVD) process when the gate conductor layer 3 is composed of a doped semiconductor material, e.g., polysilicon.

Following formation of the gate stack, the stack of material layers are patterned and etched. Specifically, a pattern is produced by applying a photoresist to the surface of the gate stack to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. The etch process for removing the exposed portions of the gate stack may be an anisotropic etch. As used herein, an "anisotropic etch process" denotes a material removal process in which the etch rate in the direction normal to the surface to be etched is greater than in the direction parallel to the surface to be etched.

The anisotropic etch process may be provided by reactive ion etch. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface.

A gate sidewall spacer 14 can be formed in direct contact with the sidewalls of the gate stack. The gate sidewall spacers 14 are typically narrow having a width ranging from 2.0 nm to 15.0 nm. The gate sidewall spacer 14 can be formed using deposition and etch processing steps. The gate sidewall spacer 14 may be composed of a dielectric, such as nitride, oxide, oxynitride, or a combination thereof.

FIG. 2 also depicts one embodiment of forming source and drain regions 16, 17 on the opposing sides of the gate structure 11. As used herein, the term "drain" means a doped region in a semiconductor substrate that is located at the end of the channel in field effect transistors (FET), in which carriers are flowing out of the transistor through the drain. As used herein, the term "source" is a doped region from which majority carriers are flowing into the channel. The source and drain regions 16,17 may be formed by ion implanting an n-type or p-type dopant into the device wafer 5. As used herein, "p-type" refers to the addition of impurities to an intrinsic semiconductor that creates deficiencies of valence electrons. In a type IV semiconductor, such as silicon (Si), examples of n-type dopants, i.e., impurities, include but are not limited to: boron, aluminum, gallium and indium. As used herein, "n-type" refers to the addition of impurities that contributes free electrons to an intrinsic semiconductor. In a type IV semiconductor, such as silicon (Si), examples of n-type dopants, i.e., impurities, include but are not limited to antimony, arsenic and phosphorous. Typically, the conductivity type, i.e., n-type or p-type conductivity, for the source and drain regions 16, 17 is the conductivity type of the semiconductor device, e.g., n-type field effect transistor (nFET) or p-type field effect transistor (pFET).

In some embodiments, multiple semiconductor devices 10 are formed on the front side surface 15 of the device wafer 5, wherein the multiple semiconductor devices 10 may include a first set of first conductivity type semiconductor, e.g., n-type FET, and a second set a second conductivity type, e.g., p-type FET. Isolation regions 18, such as trench isolation regions may be formed separating semiconductor devices of different conductivity types, e.g., electrically isolated p-type FETS from n-type FETS. For example, lithography, etching and filling of the trench with a trench dielectric may be used in forming the trench isolation region. The trench isolation region may be composed of an oxide, such as silicon oxide.

Figure 3:
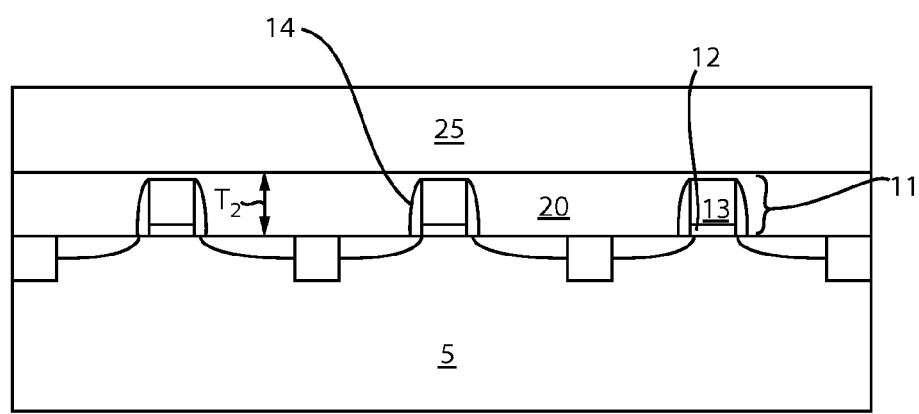
FIG. 3 is a side cross-sectional view of bonding a handling wafer to the front surface of the device wafer through an adhesive containing phenoxy resin, in accordance with one embodiment of the present disclosure.

FIG. 3 depicts bonding a handling wafer 25 to the front side surface 15 of the device wafer 5 through an adhesive layer 20 containing phenoxy resin. The adhesive layer 20 may be composed of any of the phenoxy resin compositions that have been described above including, but not limited to, Phenoxy Resin PKHC®, PKHH® or PKHJ® available from InChem Corp. In one example, the adhesive layer may be a phenoxy resin having the chemical name: polyoxy(2-hydrozy-1,3-propanediyl)oxy-1,4-phenylene(1-methylethylidene)-1,4-phenylene.

FIG. 3 depicts the device wafer 5 is bonded onto the handling wafer 25 creating a compound wafer. The bonding process should be compatible with the properties of the device wafer 5, such as surface topography, surface material, restrictions in process temperature, and combinations thereof. In some examples, the temporary adhesive, i.e., adhesive layer 20 containing phenoxy resin, provides a planar surface to the topography of the device wafer 5, and establishes a void free bond interface for bonding to the handling wafer 25.

The adhesion layer 20 may be applied to the front side surface 15 of the device wafer 5 covering the semiconductor devices 10 using a deposition process, such as spin coating. Typical spin solvents that are suitable for depositing the adhesion layer 20 using spin coating may include Propylene Glycol Methyl Ether (PGME), Propylene glycol monomethyl ether acetate (PGMEA), ethyl lactate, N-Methyl-2-pyrrolidone (NMP) and combinations thereof. In some embodiments, the spin coating solution may further include cyclohexanone.

One example of a spin coating apparatus for depositing the adhesive layer 20 is a fully automated coater system ACS200 from SUSS MicroTec. In one example, a center dispense of the liquid material may be employed followed by a spread spin at 1000 rpm for 10 seconds. After the spread spin, the material was spun off at 1400 rpm for 60 seconds. It is noted that the above described coating process is only one example of a method of depositing the adhesion layer 20 on the front surface of the device wafer 5, and that other deposition methods may be suitable for applying the adhesion layer 20. For example, the adhesion layer 20 may be deposited using spraying, brushing, curtain coating and dip coating.

Following application of the adhesive layer 20 to the front side surface 15 of the device wafer 5, a handling wafer 25 is contacted to the surface of the adhesive layer 20 that is opposite the surface of the adhesive layer 20 under temperature and pressure to provide that the handling wafer 25 is bonded to the device wafer 5 through the adhesive layer 20. In some embodiments, the thickness T2 of the adhesive layer 20 between the handling wafer 25 and the device wafer 5 may range from 2 microns to 10 microns. In other embodiments, the thickness T2 of the adhesive layer 20 may range from 2 microns to 5 microns.

The handling wafer 25 may be composed of a material and thickness to structurally support the device wafer 5 without warping or cracking during subsequent thinning steps, such as planarization and/or grinding. In one embodiment, the handling wafer 25 is composed of glass. In some embodiments, the material of the handling wafer is selected to have a coefficient of thermal expansion (CTE) that is similar to the CTE of the device wafer 5 to avoid any disadvantageous mechanical effects that can result from two materials engaged to one another having different thermal expansion coefficients, such as warping. In some embodiments, a glass handling wafer 25 may be advantageous to provide for transmission of the laser signal through the glass handling wafer 25 during subsequent laser debonding steps. In other embodiments, the handling wafer 25 may be composed of a metal material or a dielectric material. In some embodiments, the glass handling wafer 25 can be composed of a semiconductor material. For example, the above examples of semiconductor materials for the device wafer 25 are equally suitable for the semiconductor materials for the handling wafer 25.

To provide bonding, temperature and pressure was applied to the composite of the handling wafer 25, the adhesion layer 20 and the device wafer. In one embodiment, the bonding temperature may range between 150° C. to 250° C., and the pressure applied may range from 0.07 MPA to 0.22 MPa. In another embodiment, the bonding temperature may range from 175° C. to 200° C., and the pressure may range from 0.15 MPa to 0.22 MPa. The time period at which the bonding temperature and pressure is held may range from 10 minutes to 60 minutes. The bonding step may be performed in a nitrogen atmosphere.

Typically, bonding includes elevating the temperature of the adhesion layer 20 of the phenoxy resin to effectuate curing of the polymer. In some embodiments, a phenoxy resin adhesive, such as polyoxy(2-hydrozy-1,3-propanediyl) oxy-1,4-phenylene(1-methylethylidene)-1,4-phenylene, has a viscosity ranging from 100-10,000 Pa·seconds when at a temperature ranging from 160° C. to 210° C., and under a pressure of 1000 mbar per area of an 8 inch wafer size for at least one of the device wafer 5 and/or handing wafer 20. The viscosity of the phenoxy resin adhesive is at least one order of magnitude greater than typical adhesives composed of polyimides and/or poly(meth)acrylates. In prior adhesives, such as polyimide and/or poly(meth)acrylates bonding at temperatures below 300° C. resulted in too low a viscosity of the adhesive layer, which resulted in adhesive squeeze out. By providing a higher viscosity with phenoxy resin adhesives, squeeze out of the adhesion layer 20 during bonding of the handling wafer 25 to the device wafer 20 is substantially reduced if not eliminated. In some embodiments, the viscosity of the phenoxy resin at temperatures ranging from 160° C. to 210° C. may range from 1,500-10,000 Pa·second. In another embodiment, the viscosity of the phenoxy resin at temperatures ranging from 160° C. to 210° C. may range from 2500-10,000 Pa·second. In yet another embodiment, the viscosity of the phenoxy resin at temperatures ranging from 160° C. to 210° C. may range from 5000-10,000 Pa·second. In one examples, the viscosity of the phenoxyl resin at temperatures ranging from 160° C. to 210° C. may be equal to 100, 200, 300, 400, 500, 600, 700, 800, 900, 1000, 1500, 2000, 2500, 3000, 3500, 4000, 4500, 5000, 5500, 6000, 6500, 7000, 7500, 8000, 8500, 9000, 9500, and 10000 Pa·second, and any range including at least two of the above noted values.

The adhesion layer 20 following bonding to the handling wafer 25 and the device substrate 5 may have a shear strength of 40 MPa or greater.

Another advantage of the present methods is that the curing of the phenoxy resin is at temperatures less than the curing temperatures that are required of prior adhesives, such as polyimides and/or poly(meth)acrylates. For example, imidization of polyimides requires temperatures greater than 300° C., which results in damage to the device wafer, such a wafer warpage and/or cracking. Additionally, the high temperatures required of prior adhesives composed of polyimides and/or poly(meth)acrylates may also result in unnecessary out diffusion of the dopants of the semiconductor devices that have been integrated into the device wafer 5. Bonding with phenoxy resin is at temperatures below 300° C., which is at a temperature that does not damage, i.e., does not cause warping or cracking of the device wafer 5, and does not cause outdiffusion of the semiconductor device dopants. In one embodiment, the bonding temperature of the phenoxy resin adhesive may range from 150° C. to 290° C. In another embodiment, the bonding temperature of the phenoxy resin adhesive may range from 160° C. to 210° C. In other examples, the bonding temperature of the phenoxy resin may be at 150, 160, 170, 180, 190, 200, 210, 220, 240, 250, 260, 270, 280 and 290° C., as well as any range including two of the aforementioned values.

In some embodiments, the phoxyl resin adhesive that provides the adhesion layer 20 is not susceptible to degredation by exposure to the following solvents: acetone, NMP, 6N HCl, 15% $H_2O_2$, 30% $NH_4OH$, 10% Kl in $H_2O$, EtOH, MeOH, Isopropyl Alcohol (IPA), cyclohexanone, ethyl lactate, PGMEA, PGME, 30% HCl, 70% $HNO_3$ and combinations thereof.

Figure 4:
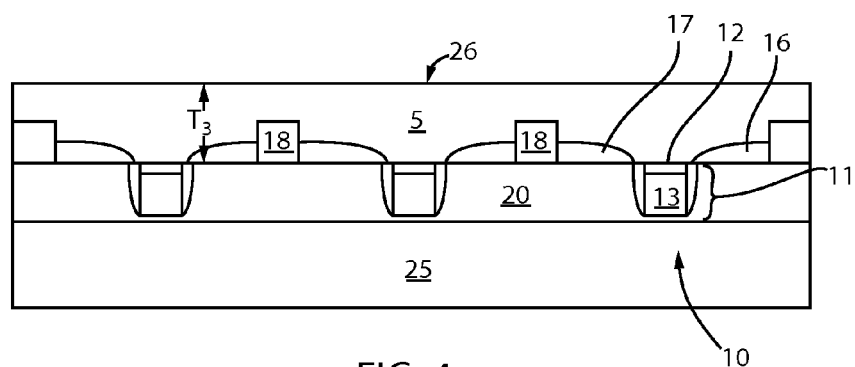
FIG. 4 is a side cross-sectional view depicting thinning the backside surface of the device wafer, in accordance with one embodiment of the present disclosure.

FIG. 4 depicting thinning the backside surface 26 of the device wafer 5. The device wafer 5 may be thinned by applying a planarization process and/or a grinding process to the backside surface 26 of the device wafer 5. In one example, the planarization and grinding process may be provided by chemical mechanical planarization (CMP). In an alternative embodiment, etch processes may be used to remove material from the back surface 26 of the device wafer 5. Following thinning of the backside surface 26 of the device wafer 5, the thinned device wafer 5 may have a thickness T3 ranging from 5 microns to 100 microns. In another embodiment, the thinned device wafer 5 may have a thickness T3 ranging from 20 microns to 50 microns. In one example, the thinned device wafer 5 may have a thickness T3 ranging from 5 microns to 10 microns. The handling wafer 25 supports the device wafer 5 during the mechanical thinning process to protect the device wafer 5 from mechanical failure, such as cracking.

Figure 5:
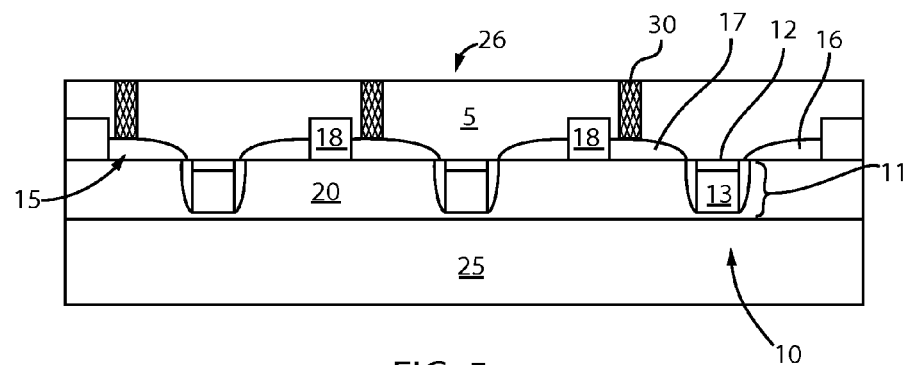
FIG. 5 is a side cross-sectional view depicting patterning the backside surface of the thinned device wafer, in accordance with one embodiment of the present disclosure.

FIG. 5 depicting one example of patterning the backside surface 26 of the thinned device wafer 5. The patterning step depicted in FIG. 5 may be employed to form interconnects to the semiconductor devices 10 that are integrated within the device wafer 5. For example, via interconnects 30, such as through silica vias (TSV), may be formed to the active regions of the device wafer 5. Through silica vias (TSV) may be employed to interconnect stacked devices wafers in forming a three dimensional (3D) microelectronic device. Vias can be formed to the active portions of the semiconductor devices, e.g., source and drain regions 16, 17, using photoresist deposition, lithographic patterning to form a photoresist etch mask, and etching, e.g., anisotropic etching. Following via formation, via interconnects 30 are formed by depositing a conductive metal into the via holes using deposition methods, such as CVD, sputtering or plating. The conductive metal may include, but is not limited to: tungsten, copper, aluminum, silver, gold and alloys thereof.

Figure 6:
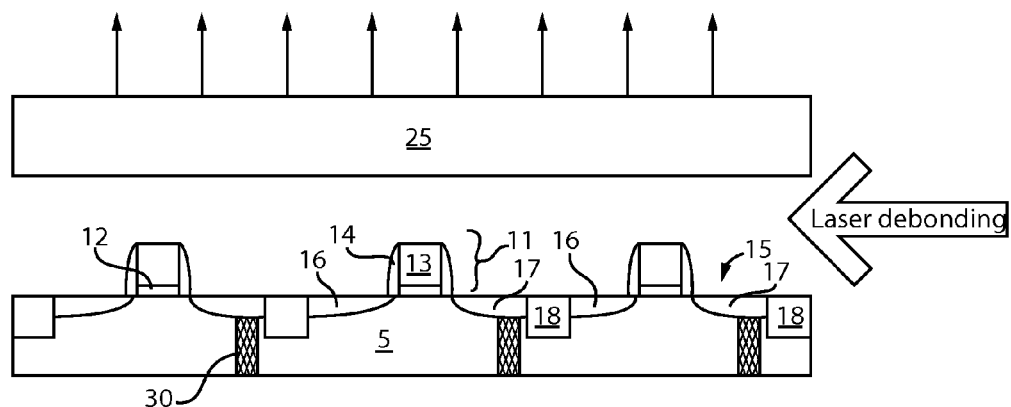
FIG. 6 is a side cross-sectional view depicting laser debonding to ablate the adhesive containing phenoxy resin, and to remove the handling wafer from the device wafer, in accordance with one embodiment of the present disclosure.

FIG. 6 depicts one embodiment of debonding the handling wafer 25 from the device wafer 5. In one embodiment, debonding of the handling wafer 25 may include laser debonding to ablate the adhesion layer 20 containing the phenoxy resin, and to remove the handling wafer 25 from the device wafer 5. Laser debonding may be provided by a 200 nm or 308 nm excimer laser. The UV laser may function using a cold process. For example, a 308 nm ultraviolet light emitted by the excimer laser is absorbed near the interface between the device wafer 5 and the glass handling wafer 25, penetrating only a few hundred nanometers. Thus, leaving the device wafer 5 unaffected. Furthermore, the ultraviolet light from the excimer laser debonds through primarily a photochemical means, by directly breaking chemical bonds in the adhesion layer 20 of phenoxy resin. The excimer laser may be applied in line mode, or step and repeat mode. The non-thermal process breaks down the temporary adhesive at the adhesion layer 20 and glass handling wafer 25 interface. Following application of the excimer layer, the handling wafer 35 may be lifted and carried away from the device wafer 5.

In some embodiments, phenoxy resin residues following removal of the adhesion layer 25 may be removed using a solvent selected from the group consisting of gamma-butyrolactone, ethyl lactate, other lactate isomers known under the tradename Gavesolv, NMP, Tetrahydrofuran (THF), PMAcetate, Methyl isobutyl ketone (MIBK), Methyl ethyl ketone (MEK), and combinations thereof.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The following examples are provided to further illustrate the present disclosure and demonstrate some advantages that arise therefrom. It is not intended that the disclosure be limited to the specific examples disclosed.

EXAMPLES

Figure 7:
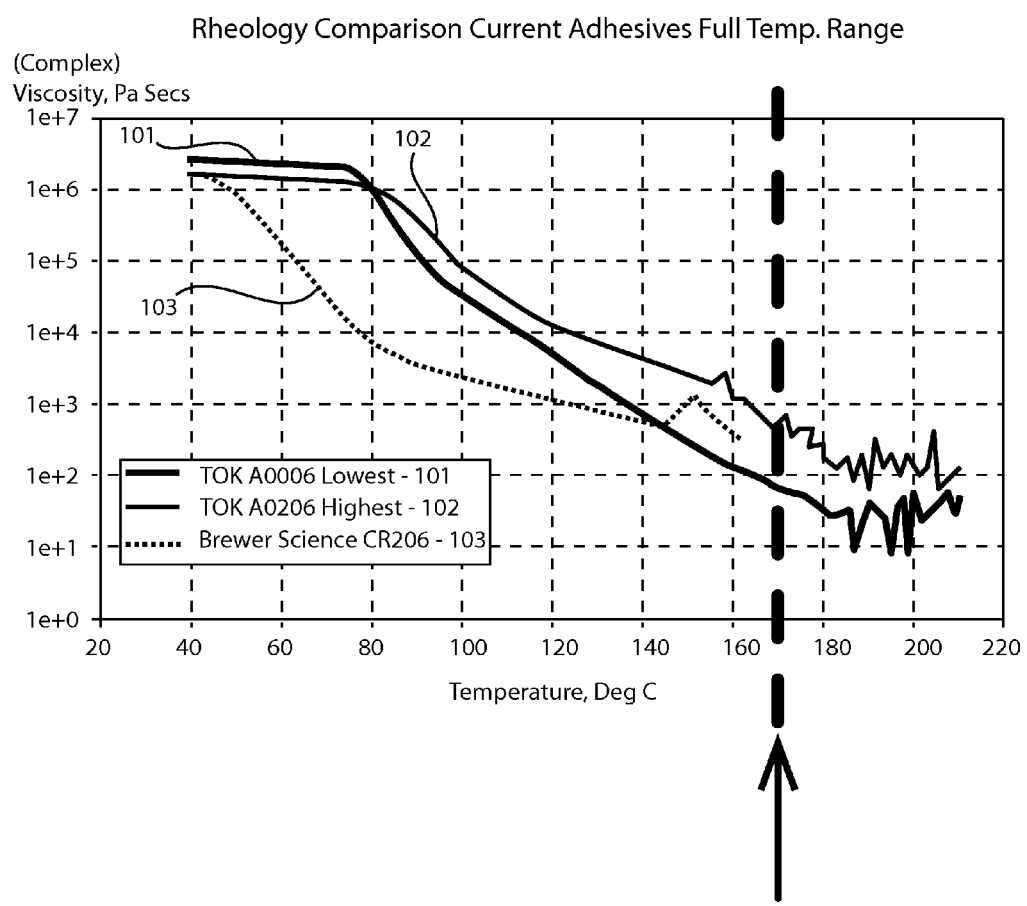
FIG. 7 is a plot illustrating the viscosity of typical adhesives, such as poly(meth)acrylate adhesives, as a function of temperature.

Wafer bond/debond adhesives were characterized by using rheology to characterize the viscosity vs temperature of known good adhesives. This rheological analysis technique was used to determine that Phenoxy resins, a family of Bisphenol A/epichlorohydrin linear polymers available from InChem Corp NC, are useful as low cost, lower-temperature-than-polyimide bonding/debonding adhesives. FIG. 7 is a plot illustrating the viscosity of typical adhesives, such as polyimide adhesives, as a function of temperature. A parallel plate rheology technique used to analyze the complex viscosity vs temperature of two TOK company adhesives and one brewer science adhesive. Plot line 101 is data measured from an adhesive having tradename TMPR A0006, and plot line 102 is data measured from an adhesive having tradename TMPR A0206 both available from Tokyo Ohka Kogyo Co. (TOK Co), and both believed to be examples of poly(meth)acrylates. Plot line 103 is data taken from a sample of tradename CR206, which is available from Brewer Science, and is also considered to be a poly(meth) acrylate. Referring to FIG. 7, at temperatures above 170° C. the viscosity of the samples provided by TMPR A0006, TMPR A0206 and CR206 decreases to the point that reliable measurements of the viscosity can no longer be recorded.

Figure 8:
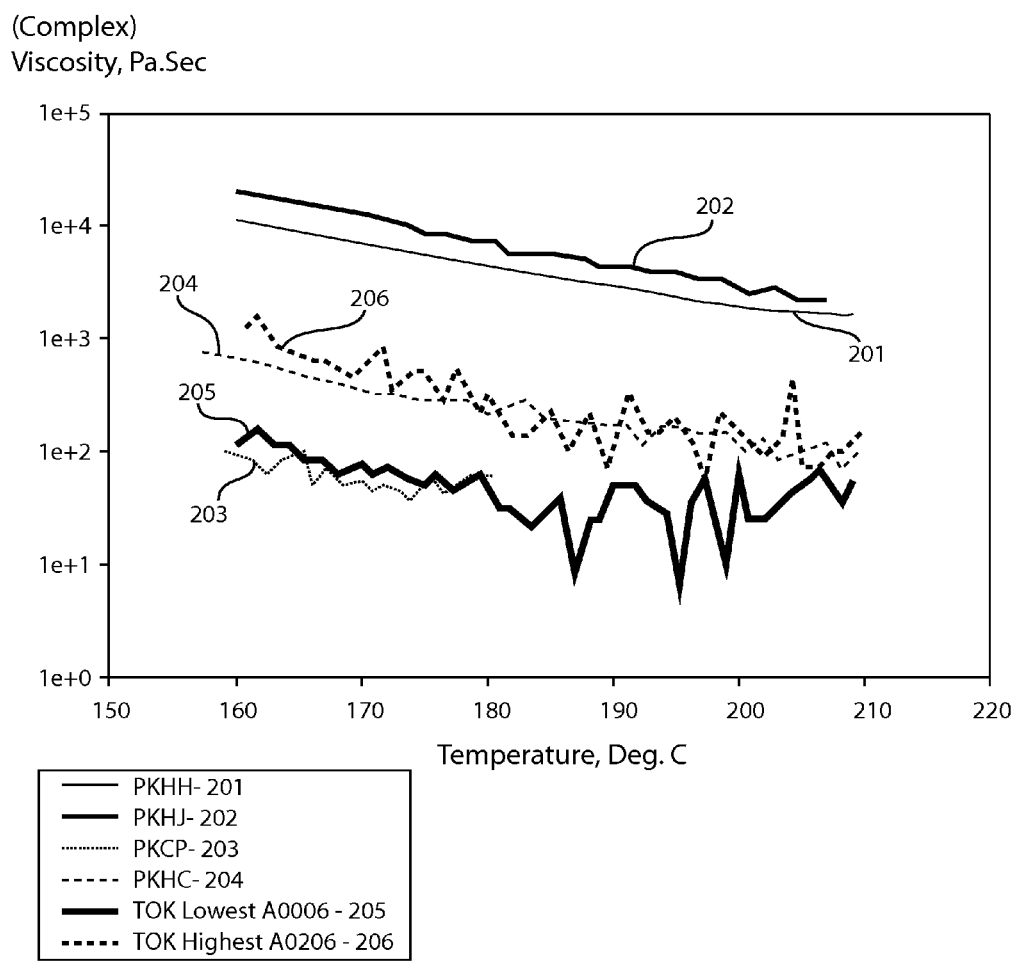
FIG. 8 is a plot illustrating a comparison of the viscosity of adhesives containing phenoxy resin in comparison to poly(meth)acrylate adhesives over a temperature range of approximately 160° C. to 210° C.

The rheological analysis techniques that provided the data in FIG. 7 where also applied to Phenoxy resins having different molecular weights. Phenoxy Resins where provided by resins having the tradenames PKHC®, PKHH® and PKHJ®, which are available from InChem Corp. Measurements of the viscosity as a function of temperature where taken from the phenoxy resins and the above described poly(meth)acrylate resins and plotted in FIG. 8 and FIG. 9. FIG. 8 is a plot illustrating a comparison of the viscosity of adhesives containing phenoxy resin in comparison to poly(meth)acrylate adhesives over a temperature range of approximately 160° C. to 210° C. Plot line 201 is a measurement of viscosity for PKHH® Phenoxy Resin. Plot line 202 is a measurement of viscosity for PKHJ® Phenoxy Resin. Plot line 203 is a measurement of viscosity for PKCP-80® Phenoxy Resin. Plot line 204 is a measurement of viscosity for PKHC-80® Phenoxy Resin. Plot line 205 is data measured from an adhesive having tradename TMPR A0006, and plot line 206 is data measured from an adhesive having tradename TMPR A0206.

FIG. 8 illustrates that Phenoxy PKHC® grade has approximately the Viscosity response as the TOK adhesives 'highest' grade poly(meth)acrylate adhesive, i.e., TMPR A0206, while the PKHH® grade of Phenoxy resin provides significantly higher viscosities at temperatures greater than 170° C. PKHC® and PKHJ® grades of Phenoxy resin provided essentially the same viscosity performance in response to temperature changes.

Figure 9:
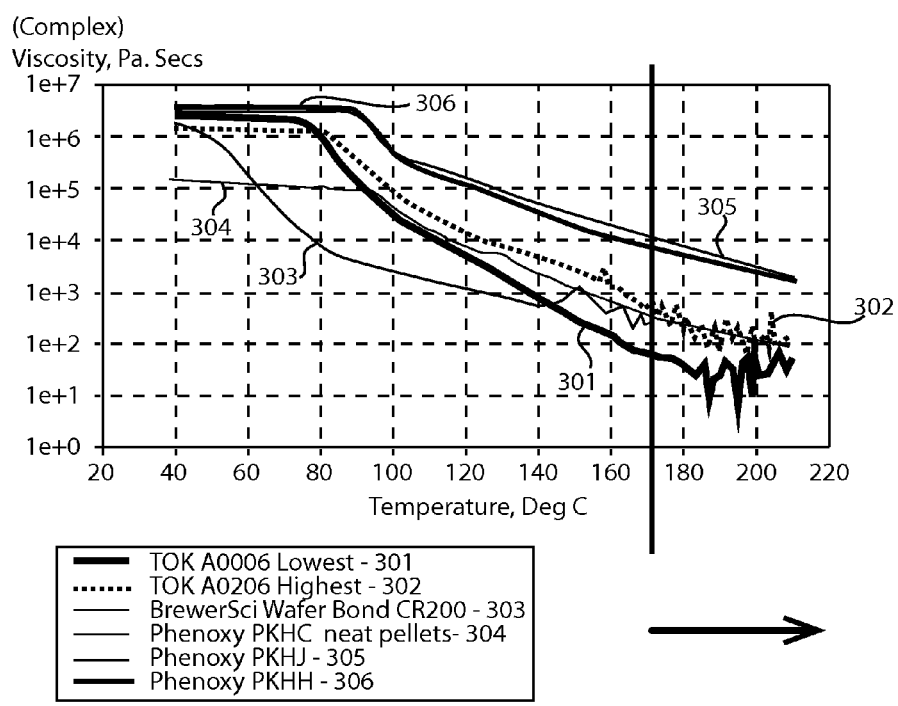
FIG. 9 is a plot illustrating a comparison of the viscosity of adhesives containing phenoxy resin in comparison to poly(meth)acrylate adhesives over a temperature range of approximately 40° C. to 210° C.

FIG. 9 is a plot illustrating a comparison of the viscosity of adhesives containing phenoxy resin in comparison to poly(meth)acrylate adhesives over a temperature range of approximately 40° C. to 210° C. Plot line 301 is data measured from an adhesive having tradename TMPR A0006, and plot line 302 is data measured from an adhesive having tradename TMPR A0206, which are available from TOK Co. Plot line 303 is data taken from an adhesive sample of tradename CR206, which are available from Brewer Science. Plot line 304 is a measurement of viscosity for PKHC® Phenoxy Resin of neat pellets. Plot line 305 is a measurement of viscosity for PKHJ® Phenoxy Resin. Plot line 306 is a measurement of viscosity for PKHC-80® Phenoxy Resin.

The data plotted in FIGS. 8 and 9 illustrate shows that phenoxy grade resins, such as PKHC®, PKHH® and PKHJ®, have comparable viscosity range to that of the TOK poly(meth)acrylate adhesive formulations, i.e., TMPR A0006 and TMPR A0206, at lower temperatures than 170° C. and have higher viscosity in the temperature range that is greater than 170° C. temperature range.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for forming a semiconductor device comprising:
   bonding a handling wafer to a front surface of a device wafer with an adhesive comprising phenoxy resin of polyoxy(2-hydrozy-1,3-propanediyl)oxy-1,4-phenylene(1-methylethylidene)-1,4-phenylene;
   thinning the device wafer from the backside of the device wafer while the device wafer is adhesively engaged to the handling wafer; and
   removing the adhesive comprising phenoxy by laser debonding, wherein the device wafer is separated from the handling wafer.

2. The method of claim 1, wherein the handling wafer comprises glass.

3. The method of claim 1 further comprising forming at least one semiconductor device on the front surface of the device wafer prior to bonding the handling wafer to the device wafer.

4. The method of claim 3, further comprising forming interconnects to the at least one semiconductor device extending through a back side surface of the device wafer.

5. The method of claim 1, wherein the bonding of the handling wafer to the device wafer comprises:
   applying a layer of the adhesive of the phenoxy resin on the front surface of the device by spin on deposition;
   contacting the layer of adhesive with the handling wafer; and
   curing the adhesive layer at a temperature less than 300° C.

6. The method of claim 1, wherein the phenoxy resin has a viscosity ranging from 100-10,000 Pa. seconds at a temperature ranging from 160° C. to 210° C., and under a pressure of at least 1000 mbar per area of an 8 inch wafer size for at least one of the device wafer and handling wafer.

7. The method of claim 1, wherein the thinning the device wafer comprises planarization or chemical mechanical polishing.

8. The method of claim 1, wherein the penoxyl resin has a molecular weight ranging from 43,000 to 57,000.

9. The method of claim 1, wherein the laser debonding comprises an excimer laser.

10. A method of forming a semiconductor device comprising:

bonding a handling wafer to a front surface of a device wafer with an adhesive comprising phenoxy resin, wherein the adhesive is cured at a temperature of less than 300° C., wherein the cured phenoxy resin may have a viscosity greater than $1 \times 10^5$ Pa·Sec, wherein the phenoxy resin has a chemical formula:

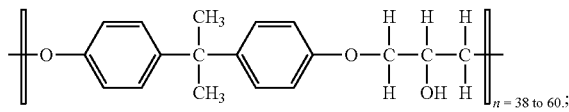

thinning the device wafer from a backside surface of the device wafer while the device wafer is adhesively engaged to the handling wafer; and removing the adhesive comprising phenoxy resin, wherein the device wafer is separated from the handling wafer.

11. The method of claim 10, wherein the handling wafer comprises glass.

12. The method of claim 10 further comprising forming at least one semiconductor device on the front surface of the device wafer prior to bonding the handling wafer to the device wafer.

13. The method of claim 10, wherein removing the adhesive comprises laser debonding.

* * * * *